US006256352B1

United States Patent
Chang

(10) Patent No.: US 6,256,352 B1
(45) Date of Patent: Jul. 3, 2001

(54) TCM DECODER AND DECODING METHOD THEREOF

(75) Inventor: Yong-deok Chang, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/223,395

(22) Filed: Dec. 30, 1998

(30) Foreign Application Priority Data

Dec. 31, 1997 (KR) .................................................. 97-82130

(51) Int. Cl.[7] .............................. H04N 7/12; H04N 5/21
(52) U.S. Cl. ..................... 375/240.26; 348/607; 375/265; 375/341
(58) Field of Search .................................. 348/607, 609, 348/610; 375/240, 265, 341, 240.26; 714/792; H04N 5/21, 7/12

(56) References Cited

U.S. PATENT DOCUMENTS

| | | | |
|---|---|---|---|
| 5,583,889 | * 12/1996 | Citta et al. | 375/341 |
| 5,594,496 | * 1/1997 | Nielsen et al. | 375/341 |
| 5,636,251 | * 6/1997 | Citta et al. | 375/341 |
| 5,875,001 | * 2/1999 | Kwak | 348/608 |

* cited by examiner

Primary Examiner—Howard Britton
Assistant Examiner—Nhon T Diep
(74) Attorney, Agent, or Firm—Sughrue, Mion, Zinn, Macpeak & Seas, PLLC

(57) ABSTRACT

A trellis coded modulation (TCM) decoder for a digital television receiver and a TCM decoding method therefor are provided. The TCM decoder includes a branch metric generator calculating a Euclidian distance between a received input data and a reference signal, corresponding to the case of 8-state passing through the comb filter and the case of 4-state not passing through the comb filter, and generating a branch metric value of a path having the smallest value from parallel-transited paths, according to each state and a parallel-transition path select signal wherein each state is based on a trellis state diagram having transition, to share 4-state and 8-state, an addition-comparison selector adding a branch metric value with respect to the parallel-transited path obtained by the branch metric generator to a previous accumulated path metric value, and comparing the added results according to each state to generate the smallest path metric value and a corresponding path select signal, and a trace-back memory tracing-back the trellis using the path select signal and the path metric values of each state, corresponding to both the 4-state and the 8-state, to thereby decode an original signal, in units of a predetermined number of symbols corresponding to interleaving in units of the predetermined number of symbols, to thereby concurrently perform decoding corresponding to an 8-state in using a comb filter for removing the effect of an NTSC signal for the receiver as well as a 4-state.

12 Claims, 14 Drawing Sheets

| $O_1$ $O_2$ $O_3$ | $M_{out}$ | $O_1$ $O_2$ $O_3$ | $M_{out}$ | $O_1$ $O_2$ $O_3$ | $M_{out}$ |
|---|---|---|---|---|---|
| -1, -1, -1 | -14 | 0, -1, -1 | -6 | 1, -1, -1 | 2 |
| -1, -1, 0 | -12 | 0, -1, 0 | -4 | 1, -1, 0 | 4 |
| -1, -1, 1 | -10 | 0, -1, 1 | -2 | 1, -1, 1 | 6 |
| -1, 0, -1 | -10 | 0, 0, -1 | -2 | 1, 0, -1 | 6 |
| -1, 0, 0 | -8 | 0, 0, 0 | 0 | 1, 0, 0 | 8 |
| -1, 0, 1 | -6 | 0, 0, 1 | 2 | 1, 0, 1 | 10 |
| -1, 1, -1 | -6 | 0, 1, -1 | 2 | 1, 1, -1 | 10 |
| -1, 1, 0 | -4 | 0, 1, 0 | 4 | 1, 1, 0 | 12 |
| -1, 1, 1 | -2 | 0, 1, 1 | 6 | 1, 1, 1 | 14 |

FIG. 5

| PREV. STATE ($S_1S_2S_3$) | CV. INPUT ($I_2$) | TRAN. STATE ($S_1S_2S_3$) | ENCODER OUTPUT ($O_1,O_2,O_3$) | DECODER OUTPUT ($I_1I_2$) | PREV. STATE ($S_1S_2S_3$) | CV. INPUT ($I_2$) | TRAN. STATE ($S_1S_2S_3$) | ENCODER OUTPUT ($O_1,O_2,O_3$) | DECODER OUTPUT ($I_1I_2$) |
|---|---|---|---|---|---|---|---|---|---|
| 000 (000) | 0 | 000 (000) | -1, 0, 0(-8) | 10 | 100 (001) | 0 | 000 (000) | -1,-1, 0(-12) | 10 |
|  |  |  | 0, 0, 0( 0) | 00 |  |  |  | 0,-1, 0(-4) | 00 |
|  |  |  | 1, 0, 0( 8) | 10 |  |  |  | 1,-1, 0(4) | 10 |
|  | 1 | 110 (100) | -1, 1, 0(-4) | 11 |  | 1 | 110 (100) | -1, 0, 0(-8) | 11 |
|  |  |  | 0, 1, 0( 4) | 01 |  |  |  | 0, 0, 0( 0) | 01 |
|  |  |  | 1, 1, 0(12) | 11 |  |  |  | 1, 0, 0( 8) | 11 |
| 001 (010) | 0 | 010 (101) | -1, 0,-1(-8) | 10 | 101 (011) | 0 | 010 (101) | -1,-1,-1(-14) | 10 |
|  |  |  | 0, 0,-1(-2) | 00 |  |  |  | 0,-1,-1(-6) | 00 |
|  |  |  | 1, 0,-1( 6) | 10 |  |  |  | 1,-1,-1( 2) | 10 |
|  | 1 | 100 (001) | -1, 1,-1(-6) | 11 |  | 1 | 100 (001) | -1, 0,-1(-10) | 11 |
|  |  |  | 0, 1,-1( 2) | 01 |  |  |  | 0, 0,-1(-2) | 01 |
|  |  |  | 1, 1,-1(10) | 11 |  |  |  | 1, 0,-1( 6) | 11 |
| 010 (101) | 0 | 001 (010) | -1, 0, 1(-6) | 10 | 110 (100) | 0 | 001 (010) | -1,-1, 1(-10) | 10 |
|  |  |  | 0, 0, 1( 2) | 00 |  |  |  | 0,-1, 1(-2) | 00 |
|  |  |  | 1, 0, 1(10) | 10 |  |  |  | 1,-1, 1(6) | 10 |
|  | 1 | 111 (110) | -1, 1, 1(-2) | 11 |  | 1 | 111 (110) | -1, 0, 1(-6) | 11 |
|  |  |  | 0, 1, 1( 6) | 01 |  |  |  | 0, 0, 1( 2) | 01 |
|  |  |  | 1, 1, 1(14) | 11 |  |  |  | 1, 0, 1(10) | 11 |
| 000 (111) | 0 | 011 (111) | -1, 0, 0(-8) | 10 | 111 (110) | 0 | 011 (111) | -1,-1, 0(-12) | 10 |
|  |  |  | 0, 0, 0( 0) | 00 |  |  |  | 0,-1, 0(-4) | 00 |
|  |  |  | 1, 0, 0( 8) | 10 |  |  |  | 1,-1, 0( 4) | 10 |
|  | 1 | 010 (011) | -1, 1, 0(-4) | 11 |  | 1 | 010 (011) | -1, 0, 0(-8) | 11 |
|  |  |  | 0, 1, 0( 4) | 01 |  |  |  | 0, 0, 0( 0) | 01 |
|  |  |  | 1, 1, 0(12) | 11 |  |  |  | 1, 0, 0( 8) | 11 |

TRANSITION SHARING BOTH
4-STATE AND 8-STATE

FIG. 17

| addr. | OUTPUT | | addr. | OUTPUT | | addr. | OUTPUT | | addr. | OUTPUT | |
|---|---|---|---|---|---|---|---|---|---|---|---|
| | ROM1 | ROM2 | | ROM1 | ROM2 | | ROM1 | ROM2 | | ROM1 | ROM2 |
| 00h | 10b | 00b | 08h | 10b | 01b | 10h | 11b | — | 18h | 11b | — |
| 01h | 00b | 10b | 09h | 00b | 11b | 11h | 01b | — | 19h | 01b | — |
| 02h | 10b | 11b | 0Ah | 10b | 00b | 12h | 11b | — | 1Ah | 11b | — |
| 03h | 00b | 01b | 0Bh | 00b | 10b | 13h | 01b | — | 1Bh | 01b | — |
| 04h | 11b | 00b | 0Ch | 11b | 11b | 14h | 10b | — | 1Ch | 10b | — |
| 05h | 01b | 10b | 0Dh | 01b | 01b | 15h | 00b | — | 1Dh | 00b | — |
| 06h | 11b | 11b | 0Eh | 11b | 10b | 16h | 10b | — | 1Eh | 10b | — |
| 07h | 01b | 01b | 0Fh | 01b | 00b | 17h | 00b | — | 1Fh | 00b | — |

TCM DECODER AND DECODING METHOD THEREOF

BACKGROUND OF THE INVENTION

1. Field of the Invention

The present invention relates to a trellis-coded modulation (TCM) decoder and a decoding method thereof, and more particularly, to a TCM decoder for a digital television receiver and a decoding method thereof.

2. Description of the Related Art

A grand alliance (GA)-HDTV which has been developed in the United States in accordance with the study of a large-scale screen and high resolution television, has adopted a vestigial side band (VSB) modulation of a digital transmission method, which is called a GA-VSB system.

One of characteristics of the GA-VSB system selected as the standard for American terrestrial HDTV broadcasting is to employ trellis-coded modulation (TCM) for increasing noise immunity. The TCM which concurrently applies a function of error correction to a conventional modulation technique, can increase transmission efficiency without increase in the bandwidth.

The structure of a TCM coder of the GA-VSB system is shown in FIG. 1A. In the TCM coder, one bit $I_2$ of 2-bit input $I_1 I_2$ is input to a convolution coder 106, which has a 2-bit output $O_2 O_3$, and the other bit $I_1$ of 2-bit input $I_1 I_2$ is input to a precoder 100, corresponding to an NTSC rejection filter used for a receiver of the GA-VSB system, which generates a 1-bit output $O_1$.

If 3-bits $O_1 O_2 O_3$ are input to a mapper 114, one symbol $M_{OUT}$ is output. $M_{OUT}$ has one of 8 levels corresponding to the respective 3-bit sequence $O_1 O_2 O_3$ as shown in the table of FIG. 1B. Here, delays 104, 108 and 112 indicated by the designation "D", delay input data by a 12-symbol interval and have the same effect as that obtained by parallel-processing 12 coders having a unit delay, which is called 12-symbol interleaving. The 12-symbol interleaving can reduce a burst type noise, and the number of states of the TCM decoder increases when an NTSC rejection filter is used for a receiver, which is one of characteristics of the GA-VSB system.

The Trellis diagram of FIG. 2 shows the state of the TCM coder shown in FIG. 1A. The number of memories, which corresponds to delays, of a convolution coder 106 of FIG. 1A, is two, so that the total state number is four, and the convolution-uncoded bit is one, so that the number of parallel paths indicating the number of transition types is two. For example, in order to transit to the next state 00 when the previous state is 10, input data $I_1 I_2$ of the coder are 01 and 11, and two types of parallel paths are obtained.

The function of the TCM coder of the GA-VSB system of FIG. 1A is disclosed in Grand Alliance HDTV System Specification, submitted to the ACATS Technical Subgroup, February 1994, but the structure of the TCM decoder has not been disclosed.

SUMMARY OF THE INVENTION

It is an objective of the present invention to provide a TCM decoder realized by simple hardware for a GA-VSB system.

It is another objective of the present invention to provide a TCM decoder capable of decoding in a 12-symbol unit corresponding to 12-symbol interleaving and of decoding corresponding both when the NTSC rejection filter for the GA-VSB system is used and when it is not used.

It is still another objective of the present invention to provide a TCM decoding method for a GA-VSB system.

Accordingly, to achieve the first and second objectives, a TCM decoder according to the present invention includes: a branch metric generator calculating a Euclidian distance between a received input data and a reference signal, corresponding to the case of 8-state passing through the comb filter and the case of 4-state without passing through the comb filter, and generating a branch metric value of a path having the smallest value from parallel-transited paths, according to each state and a parallel-transition path select signal wherein said each state is based on a trellis state diagram having transition so that the structure for the 4-state and the 8-state is shared; an addition-comparison selector adding a branch metric value with respect to the parallel-transited path obtained by the branch metric generator to a previous accumulated path metric value, and comparing the added results according to each state to generate the smallest path metric value and a corresponding path select signal; and a trace-back memory tracing-back the trellis using the path select signal and the path metric values of each state, corresponding to both the 4-state and the 8-state, to thereby decode an original signal, in units of a predetermined number of symbols corresponding to interleaving in units of the predetermined number of symbols.

To achieve the third objective, a TCM decoding method decoding signals to 4-state or 8-state in accordance with whether to use a comb filter for removing the effect of an NTSC signal includes the steps of: calculating a Euclidian distance between received input data corresponding to the case of 8-state passing through the comb filter and the case of 4-state without passing through the comb filter and a reference signal, and generating a branch metric value of a path having the smallest value from the parallel-transited paths according to each state and a parallel-transition path select signal, wherein said each state is based on a trellis state diagram having transition to share the 4-state and 8-state, adding a branch metric value with respect to a generated parallel-transited path to a previous accumulated path metric value, comparing the added result in accordance with each of the states to accordingly generate a path metric value of the smallest state value and a corresponding path select signal, and tracing-back the trellis using the path select signal and the path metric value of each state, corresponding to both the 4-state and the 8-state, to thereby decode an original signal in units of a predetermined number of symbols corresponding to interleaving in units of the predetermined number of symbols.

BRIEF DESCRIPTION OF THE DRAWINGS

The above objectives and advantages of the present invention will become more apparent by describing in detail preferred embodiments thereof with reference to the attached drawings in which:

FIG. 5 is a state table of the 8-state TCM coder shown in FIG. 4A;

FIG. 17 is a ROM table of first and second ROMs of FIG. 16.

DESCRIPTION OF THE PREFERRED EMBODIMENTS

In order to realize a TCM decoder according to the present invention, when an NTSC rejection filter is used for a receiver of a GA-VSB system, the effect of the NTSC rejection filter must be considered.

When an NTSC signal exists in an HDTV channel, the NTSC signal acts as interference. In order to reduce the influence of the interference, a modulation carrier of the NTSC signal is removed typically by using a comb filter in the receiver of the GA-VSB system.

Figure 3:
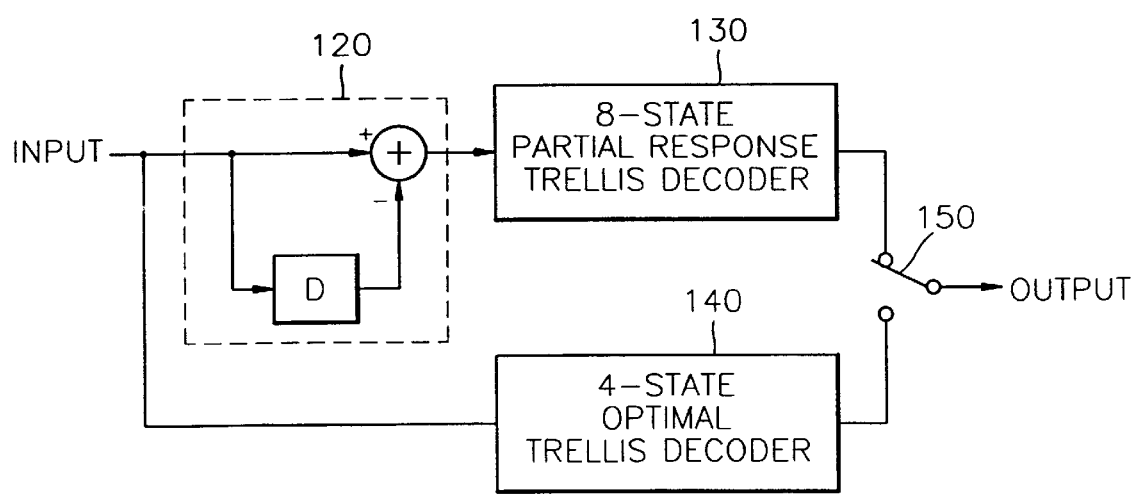
FIG. 3 shows a trellis decoder corresponding to the use of an NTSC rejection filter.

As shown in FIG. 3, an original VSB signal has 8 levels, i.e., ±7, ±5, ±3 and ±1, and the output of the comb filter 120 has 15 levels ±14, ±12, ±10, ±8, ±6, ±4, ±2 and 0. Thus, the receiver of the GA-VSB system requires an 8-state partial response trellis decoder 130, since the signal to be decoded is 8-state rather than 4-state when the comb filter 120 is used to remove NTSC interference, and a 4-state optimum trellis decoder 140 for use when the comb filter is not used.

Figures 4A, 4B:
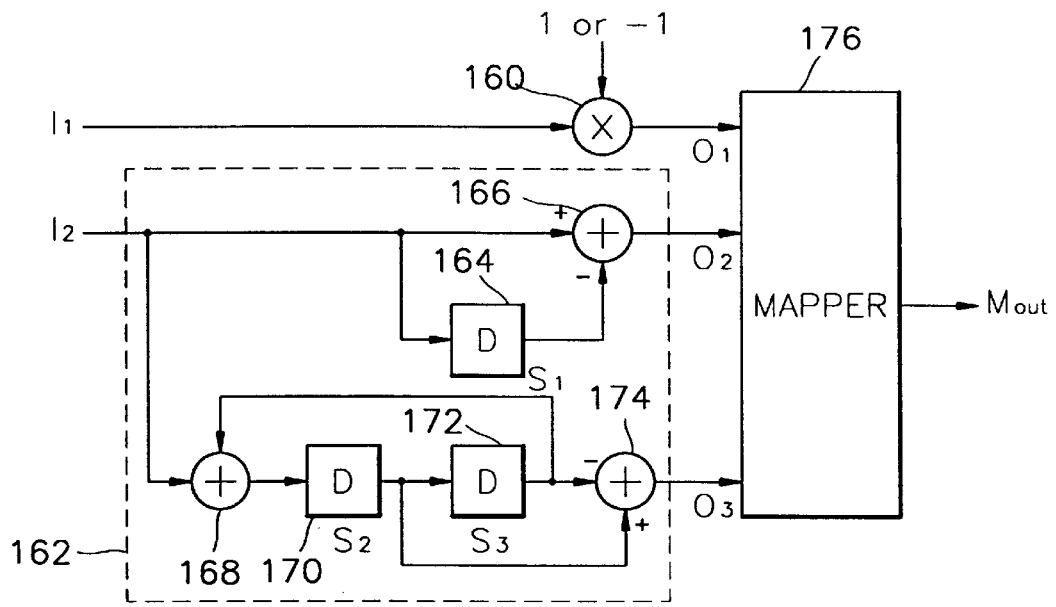
FIG. 4A shows the structure of an 8-state TCM coder in which a TCM coder and an NTSC rejection filter are combined.
FIG. 4B is a table showing the input and output of a mapper of FIG. 4A.

A state table or a trellis diagram for the 8-state structure is used to design the 8-state TCM decoder, and thus the 8-state TCM coder can be formed by combining the TCM coder shown in FIG. 1 with the comb filter, as shown in FIG. 4A.

The precoder of the 8-state TCM coder of FIG. 1 can be replaced with a multiplier 160 (FIG. 4A) for multiplying MSB($I_1$) of the 2-bit parallel input by 1 or −1 in case that the precoder 100 of FIG. 1 and a comb filter 120 of FIG. 3 are combined. Also, a delay 164 of the convolution coder 162 of the 8-state TCM coder delays LSB($I_2$) of the 2-bit parallel input, and a subtracter 166 subtracts an output of the delay 164 from the LSB($I_2$).

An adder 168 adds the LSB($I_2$) to an output of a delay 172, a delay 170 delays an output of the adder 168, and the delay 172 delays the output of the delay 170, to then be fed back to the adder 168. A subtracter 174 subtracts the output of the delay 172 from the output of the delay 170.

The 8-state TCM coder includes a mapper 176 having the input and output as shown in FIG. 4B.

The operation of the 8-state TCM coder shown in FIG. 4A will be described with respect to the case in which the previous state is 011.

When the LSB($I_2$) of the 2-bit parallel input is 0, the next state becomes 011, and the 2-bit output $O_2O_3$ of the convolution coder 162 becomes 00, and when the MSB input to the multiplier 160 is 0, the output of the mapper 176 becomes 0(000). Also, when the MSB input to the multiplier 160 is 1, the output of the mapper 176 becomes −8(−100) or 8(100).

When the LSB($I_2$) of the 2-bit parallel input is 1, the next state becomes 101, and the 2-bit output $O_2O_3$ of the convolution coder 162 becomes 10, and when the MSB input to the multiplier 160 is 0, the output of the mapper 176 becomes 4(010). Also, when the MSB input to the multiplier 160 is 1, the output of the mapper 176 becomes −4(−110) or 12(110).

FIG. 5 is a state table calculated by the 8-state TCM coder shown in FIG. 4A. In order to simplify the hardware in realizing the TCM decoder, i.e., in order to have transitions for sharing both a 4-state and an 8-state as shown in the trellis diagram of FIG. 7, the previous state value and the next state value must be changed to values in a parenthesis, where the decoding data values are not changed.

Thus, in designing of the TCM decoder structure of a GA-VSB system, two points are considered. One is that the NTSC rejection filter subtracts a 12-symbol delay signal from the input signal, so that the TCM coder has the 12-symbol interleaved shape, thus the TCM decoder performs decoding in units of 12-symbols. The other is that the TCM decoder has decoders of two types, i.e., the 4-state type and the 8-state type for the NTSC rejection filter.

Figure 6:
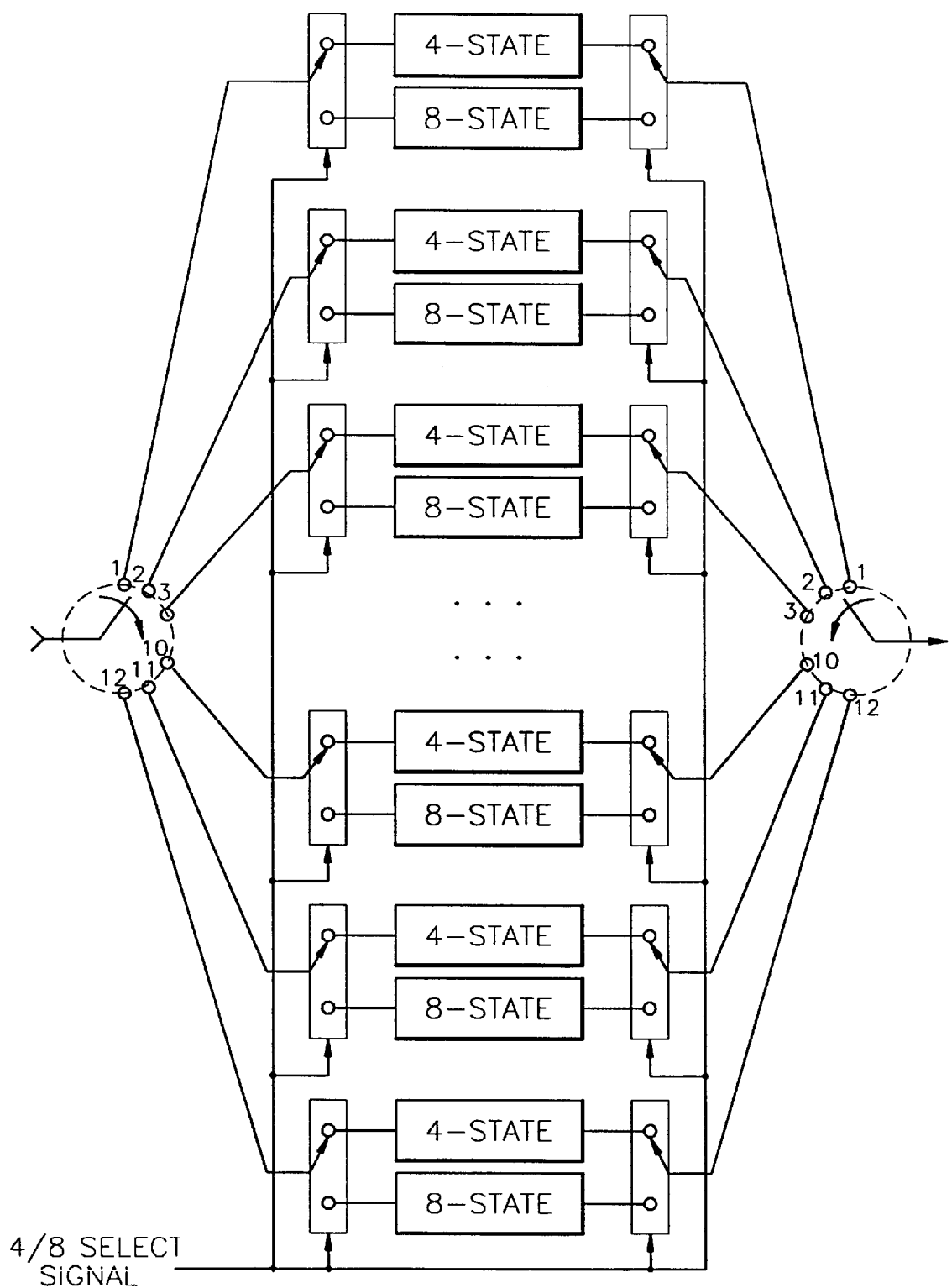
FIG. 6 is a conceptual block diagram of a TCM decoder of a GA-VSB system.

In FIG. 6, twelve 4-state decoders each having a unit delay and twelve 8-state TCM decoders each having a unit delay, have different state numbers and input symbols from each other. However, the decoding process is the same, so that the two types of decoders can be combined into one, and the 12-symbol interleaving can be realized by one decoder through proper timing control.

Thus, the TCM decoder according to the present invention includes a decoder capable of corresponding to both the 4-state and 8-state, and can perform decoding in a 12-symbol unit in one TCM decoder, to thereby reduce the total amount of hardware.

Hereinafter, a preferred embodiment of a TCM decoder according to the present invention and a decoding method therefor will be described with reference to the attached drawings.

Figure 7:
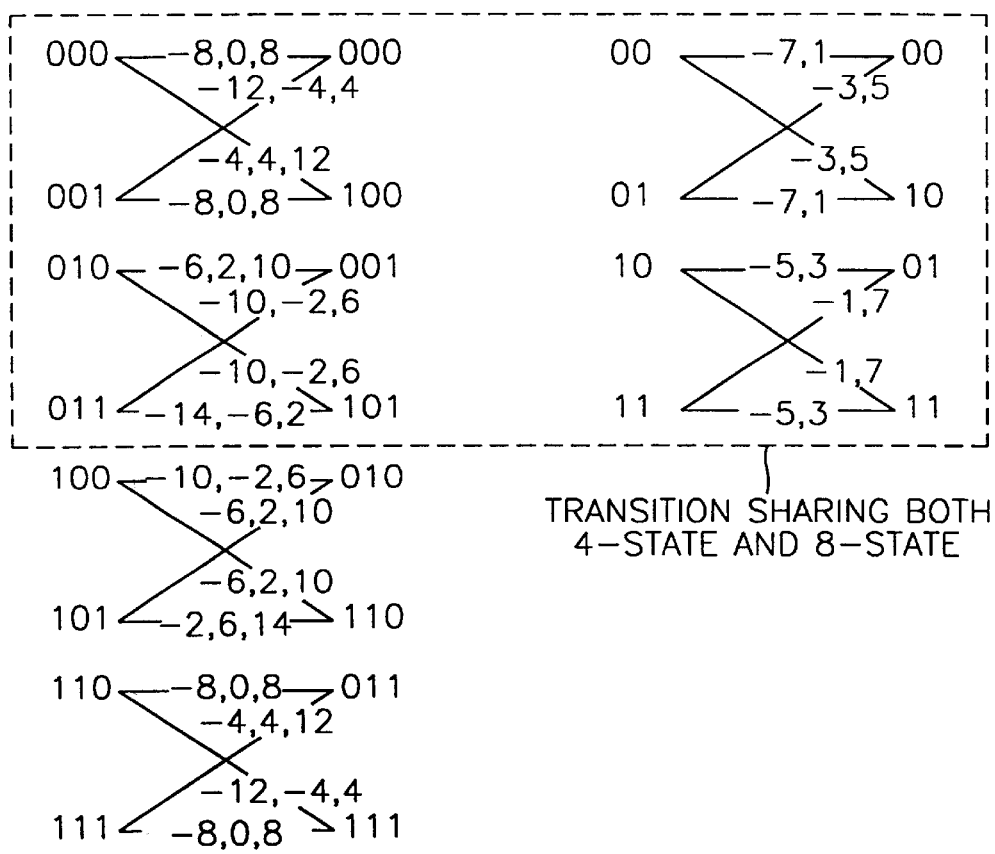
FIG. 7 is a trellis diagram showing transition to be shared by 4-state and 8-state according to the present invention.
Figure 8:
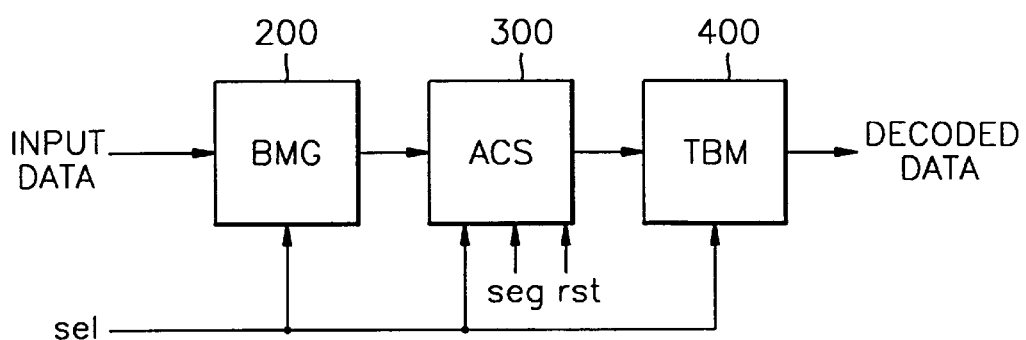
FIG. 8 is a block diagram of a TCM decoder according to the present invention.

In FIG. 8 which is a block diagram of the TCM decoder according to the present invention, a branch metric generator (BMG) 200 calculates a distance between each state value set on the trellis diagram of FIG. 7 and a received input value, to thereby generate a branch metric.

An addition-comparison selector (ACS) 300 adds the accumulated path metric before a current time (T=$t_{-1}$) to the branch metric at the current time (T=$t_0$) with respect to the path of each of the states in accordance with a state diagram, compares path metrics obtained from each of the states, selects a smaller one from the compared path metrics, applies a path select signal of the smallest path metric to a trace-back memory (TBM) 400, and updates the selected path metric to an accumulated path metric at T=$t_0$. In a next time point (T=$t_1$), the same process as that at the point in time when T=$t_0$, is sequentially performed.

The TBM 400 traces-back the trellis as deep as the decoding depth, i.e., the decision depth which is the depth for detecting the value to be decoded by tracing back the survival path from a current point in time to an arbitrary previous point in time, using the path select signal and the path metric, to thereby decode original data. Here, the decoded data is delayed by the decision depth and then the delayed data is output.

The 4-state and 8-state select signal (sel) indicates whether input data passes through the comb filter, and indicates 8-state at logic high and 4-state at logic low. The 4-state and 8-state select signal sel is applied to BGM 200, ACS 300 and TBM 400, and a segment control signal (seg) indicating a segment interval and a system reset signal (rst) are applied to the ACS 300.

Figure 9:
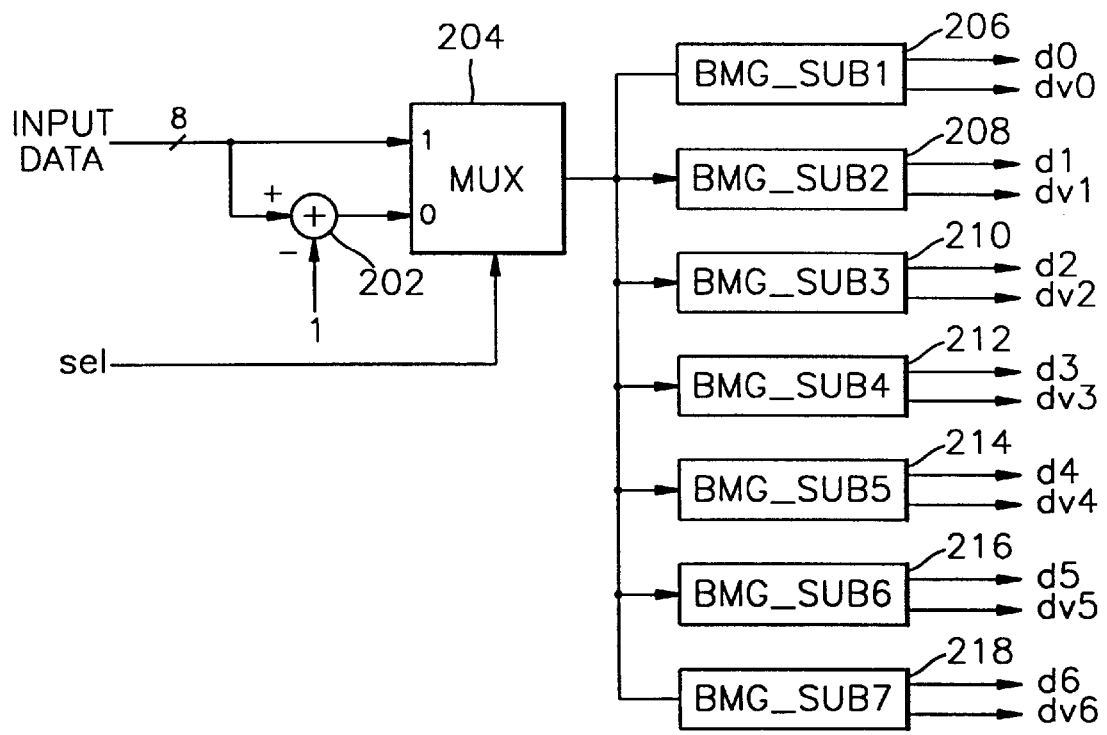
FIG. 9 is a detailed block diagram of a branch metric generator of FIG. 8.

Referring to FIG. 9 which is a detailed block diagram of the branch metric generator 200 of FIG. 8, in the case of 4-state, i.e., when the 4-state and 8-state select signal sel is applied to a multiplexer 204, a reference level has a value of {−7, −5, −3, −1, 1, 3, 5, 7} unlike in the case of 8-state, so that when 1 is subtracted from input data in a subtracter 202, a value {−8, −6, −4, −2, 0, 2, 4, 6} is output through the multiplexer 204.

Meanwhile, referring to FIG. 7, parallel-transited values among 15-level values depending on the 8-state, are grouped as (−8, 0, 8), (−6, 2, 10), (−10, −2, 6), (−4, 4, 12), (−12, −4, 4), (−2, 6, 14) and (−14, −6, 2), and parallel-transited values among 8-level values depending on the 4-state, are grouped (−8, 0), (−6, 2), (−4, 4) and (−2, 6).

Thus, first through seventh subunits 206 through 218 calculate the branch metric value for the path parallel-transited in accordance with the state-diagram of FIG. 7.

That is, the first subunit 206 generates a branch metric value d0 for the parallel-transited path (−8, 0, 8) and a parallel-transition path select signal dv0. The second subunit 208 generates a branch metric value d1 for the parallel-transited path (−10, 2, 6) and a parallel-transition path select signal dv1. The third subunit 210 generates a branch metric value d2 for the parallel-transited path (−6, 2, 10) and a parallel-transition path select signal dv2. The fourth subunit 212 generates a branch metric value d3 for the parallel-transited path (−12, −4, 4) and a parallel-transition path select signal dv3. The fifth subunit 214 generates a branch metric value d4 for the parallel-transited path (−4, 4, 12) and a parallel-transition path select signal dv4. The sixth subunit 216 generates a branch metric value d5 for the parallel-transited path (−14, −6, 2) and a parallel-transition path select signal dv5. The seventh subunit 206 generates a branch metric value d6 for the parallel-transited path (−2, 6, 12) and a parallel-transition path select signal dv6.

Figure 10:
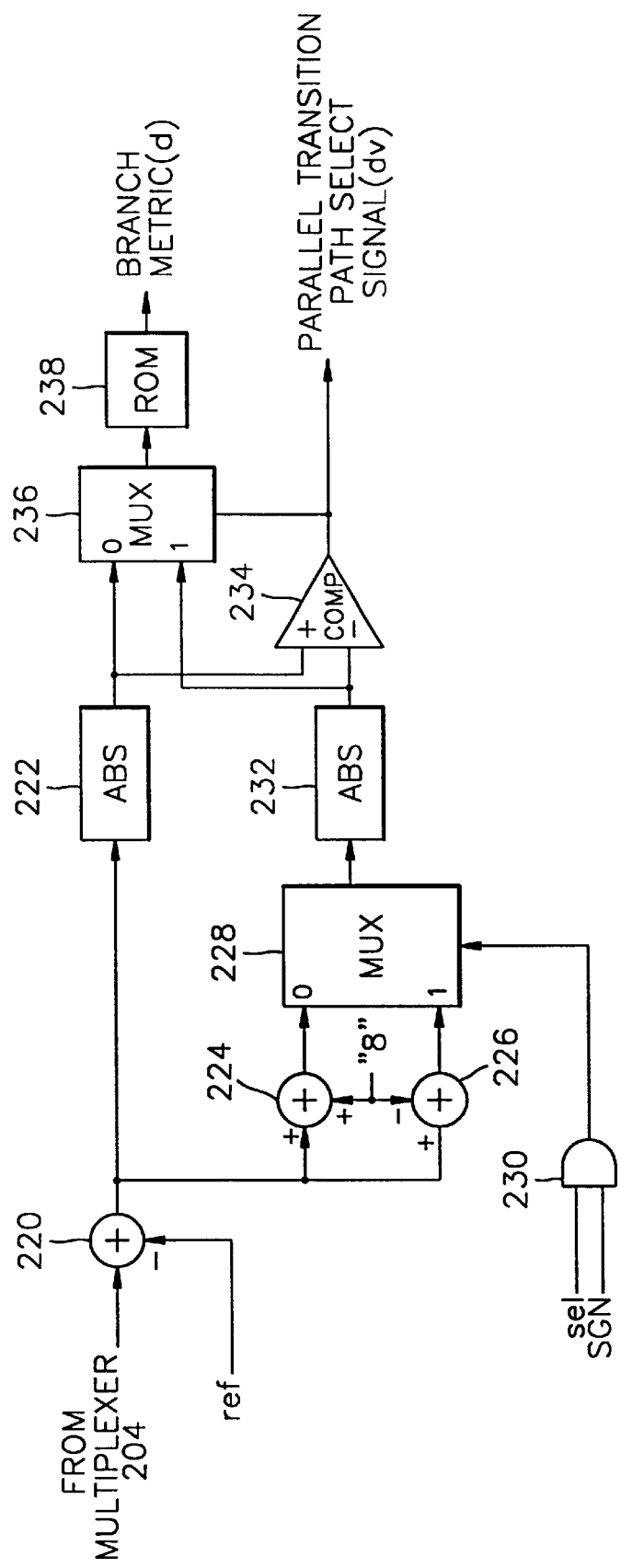
FIG. 10 is a detailed circuit diagram of subunits of FIG. 9.

Referring to FIG. 10 which is a detailed circuit diagram of each of the subunits of FIG. 9, a subtracter 220 subtracts a reference level value ref from input data supplied from the multiplexer 204 of FIG. 9, and an absolute value extracter 222 obtains an absolute value of the output of the subtracter 220. Here, the reference level values ref are 0, ±2, ±4 and ±6.

An adder 224 adds 8 to the output of the subtracter 220 and applies the added value to one input terminal 0 of a multiplexer 228, and the subtracter 226 subtracts 8 from the output of the subtracter 220 and applies the subtracted value to the other input terminal 1 of the multiplexer 228. An AND gate 230 controls selection of the multiplexer 228 in accordance with the result obtained by OR-operating the 4-state and 8-state select signal sel to a sign signal SGN. Here, the sign signal SGN is a sign of the output of the subtracter 220.

That is, the parallel-transited values are 8-levels different from each other, and when the reference level has a middle value, the difference between the reference level value and a received value is obtained, the sign of which is used to select a parallel-transited value.

Also, one value is selected from the values obtained by adding +8 and −8 to the difference between the reference level value and the received value, respectively, using a sign signal, and an absolute value of the selected value is obtained in an absolute value extractor 232. A comparator 234 compares the output of the absolute value extractor 222 with the output of the absolute value extractor 232 and outputs the smaller value as a parallel-transition path select signal dv.

Also, the smaller one of the outputs of the absolute value extractors 222 and 232 selected by the multiplexer 236 in accordance with the comparison result of the comparator 234 is applied to a ROM 238. The selected value which may be realized by a squaring logic circuit, is realized by the ROM 238 in which a squaring value of the selected value is stored, and the branch metric value is output from the ROM 238, according to the present invention. Here, the branch metric value d and the parallel-transition path select signal dv are applied to the ACS 300 of FIG. 8. Here, the absolute value extractors 222 and 232 and the comparator 234 may be called a first generator, and the ROM 238 may be called a second generator.

Meanwhile, the TCM decoder of the GA-VSB system requires a function for decoding both the 4-state and the 8-state, so that a functional block of the addition-comparison selector 300 must be shared to reduce the number of gates in realizing an application specific integrated circuit (ASIC).

Figure 2:
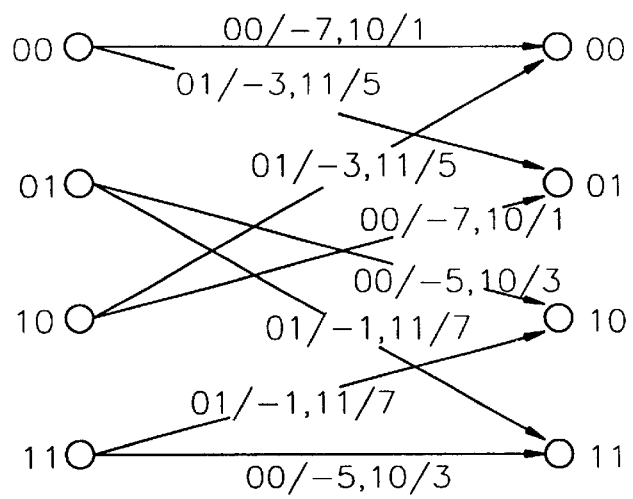
FIG. 2 is a trellis diagram of the TCM coder of FIG. 1.

Accordingly, when the structure of state transition in the 8-state of FIG. 5 is changed to the state transition shown in the parentheses, the 8-state trellis diagram of FIG. 7 can be obtained, and the state transition in the 4-state of FIG. 2 must be also changed to the trellis diagram of FIG. 7.

The portion indicated by dotted lines of FIG. 7 shows transition to be shared by the 8-state and the 4-state. For example, a path of the state 000 to the state 000 in the 8-state structure can be shared with a path of the state 00 to the state 00 in the 4-state, and the metric of −7 and 1 in the 4-state can be shared with the metric of −8 and 0 in the 8-state, by subtracting 1 from the input data received by the subtracter 202 of the branch metric generator 200 of FIG. 9. The detailed circuit diagram of the addition-comparison selector 300 realized based on the trellis diagram of FIG. 7 is shown in FIG. 11.

Figure 11:
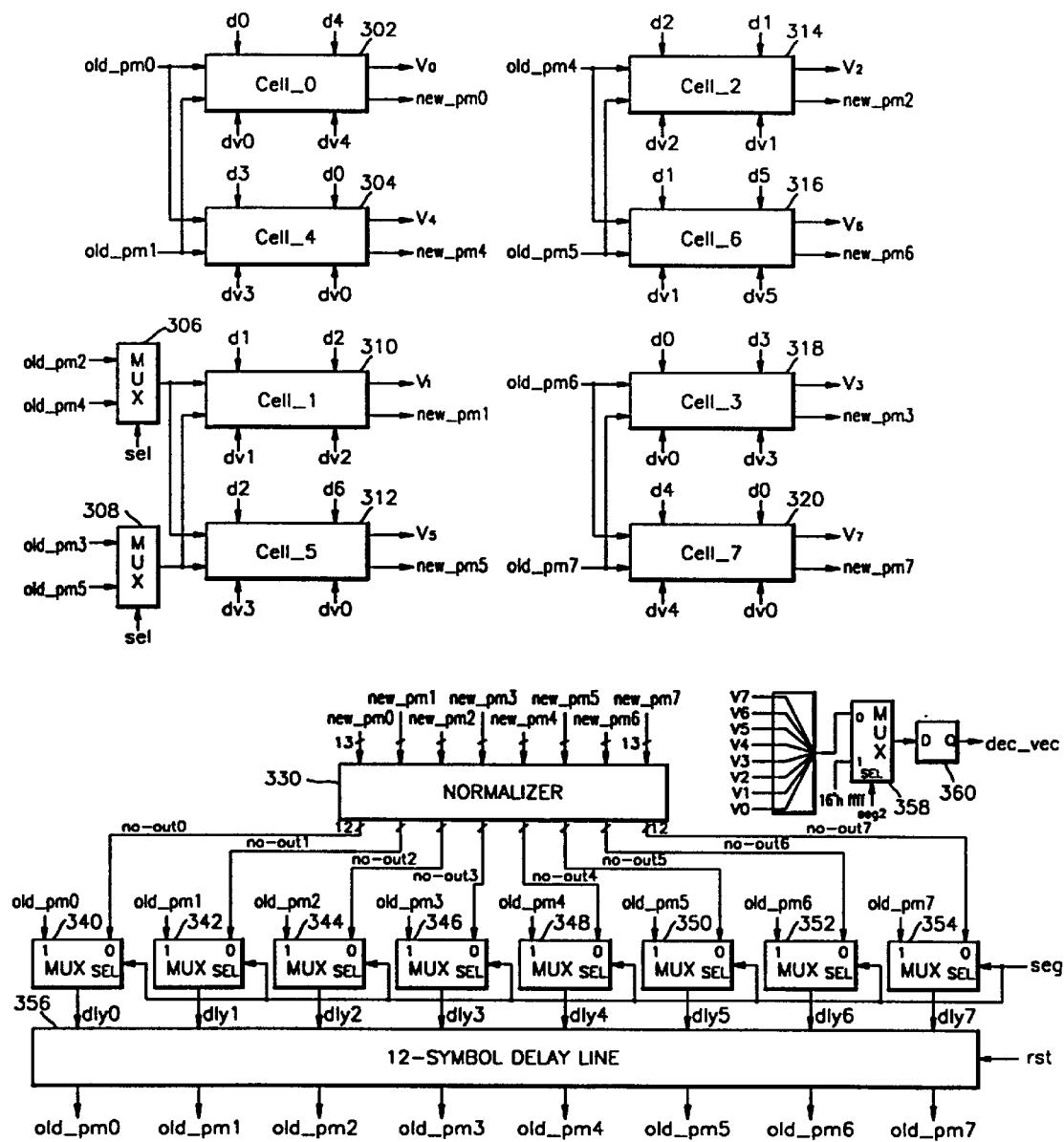
FIG. 11 is a detailed block diagram of an addition-comparison selector of FIG. 8.

In FIG. 11, each of survival path determiners 302, 304 and 310 through 320 (indicated by a cell) receives the branch metric values d0 through d6 calculated by the BMG 200 and the previous path metrics old_pm0 through old_pm7 supplied from a 12-symbol delay line 356 to generate new path metric new_pm and a decision vector V with respect to each state.

In eight survival path determiners, for example, the first survival path determiner 302 receives the path metric old_pm0 accumulated in the previous state 000 in accordance with the state diagram of FIG. 7 and the path metric old_pm1 accumulated in the previous state 001, determines a path having a smaller value of the branch metrics d0 and d4 as a survival path, and generates a decision vector v0 of the path decided as the survival path.

Figure 12:
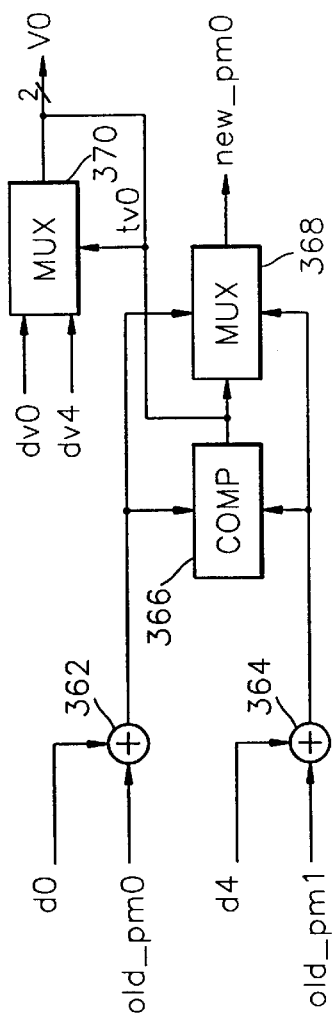
FIG. 12 is a detailed circuit diagram of a first survival path determiner of FIG. 11.

That is, in the first survival path determiner 302 as shown in FIG. 12, an adder 362 adds the path metric old_pm0 accumulated in the previous state 000 to the branch metric d0 output from the first subunit 206 of FIG. 9, and an adder 364 adds the path metric old_pm1 accumulated in the previous state 011 to the branch metric d4 output from the fifth subunit 214.

When a comparator 366 compares an output of the adder 362 and an output of the adder 364 and applies a select signal to a multiplexer 368 to select a smaller one of the two outputs of the adders 362 and 364, the multiplexer 368 outputs the output of the adder having the smaller value as a path metric new_pm0 at the current point in time and, the output of the comparator 366 is output as a state-transition path select signal tv0.

A multiplexer 370 selects a parallel-transition path select signal for a path selected from a parallel-transition path select signal dv0 with respect to the previous state 000 and a parallel-transition path select signal dv4 with respect to the previous state 011 in accordance with the state-transition path select signal tv0, and adds the selected parallel-transition path select signal to the state-transition path select signal supplied from the comparator 366 to generate information of the previous state, i.e., a decision vector v0 of 2-bits from the current state.

Meanwhile, in order to share the 4-state and the 8-state as shown in FIG. 7, survival path determiners 310 and 312 of FIG. 11 receive the previous path metric old_pm2 or old_pm4 selected from a multiplexer 306, and previous path metric old_pm3 or old_pm5 selected from a multiplexer 308.

That is, each of the multiplexers 306 and 308 in the 8-state selects the path metric old_pm2 accumulated in the previous state 010 and the path metric old_pm3 accumulated in the previous state 011 which are input to a first input terminal 1, and in the 4-state selects the path metric old_pm4 accumulated in the previous state 100 and the path metric old_pm5 accumulated in the previous state 101 which are input to a second input terminal 0, in accordance with a 4-state and 8-state select signal sel.

Meanwhile, since the path metric is limited to 12-bits, a normalization process is required to suppress overflow. Thus, if a normalizer 330 checks the MSBs of new path metrics new_pm0 through new_pm7 output from the survival path determiners 302, 304, 310 through 320, and one of them is 1, eight path metrics are shifted to the right by 1-bit to output normalized path metrics no_out0 through no_out7.

Multiplexers 340 through 354 select either normalized path metrics no_out0 through no_out7 or the previous path metrics old_pm0 through old_pm7, in accordance with a segment synchronization signal seg. That is, if the signal seg is logic low indicating no segment synchronization interval, normalized path metrics no_out0 through no_out7 input to the first input terminal 0 are selected, and then the elected normalized path metric no_out0 through no_out7 is delayed by 12-symbol intervals in a 12-symbol delay line 356 to generate the previous path metrics old_pm0 through old_pm7; and if the signal seg is high, indicating a segment synchronization interval, the previous path metrics old_pm0 through old_pm7 of the 12-symbol delay line 356 fed back to the second input terminal 1 are selected and output to the 12-symbol delay line 356. Here, the 12-symbol delay line 356 delays the outputs of the multiplexers 340 through 354 by 12-symbols to correspond to 12-symbol interleaving of the TCM coder. The previous path metrics old_pm0 through old_pm7 output from the 12-symbol delay line 356 are applied to each of the survival path determiners 302, 304, and 310 through 320. The 12-symbol delay line 356 is reset when a field synchronization ends, in accordance with a reset signal rst.

Meanwhile, the multiplexer 358 selects previous state information $V_0$ through $V_7$ of 2-bit output from survival path determiners 302, 304 and 310 through 320 during no segment synchronization interval of logic low, and selects (ffff)$_{HEX}$ of hexadecimal digit during the segment synchronization interval of logic high, in accordance with a segment synchronization signal seg, to thereby output the selected information as a decision vector dec_vec through a D-flipflop 360. Thus, the ACS 300 outputs a decision vector dec_vec with respect to each state and path metrics new_pm0 through new_pm7 of each state.

Figure 13:
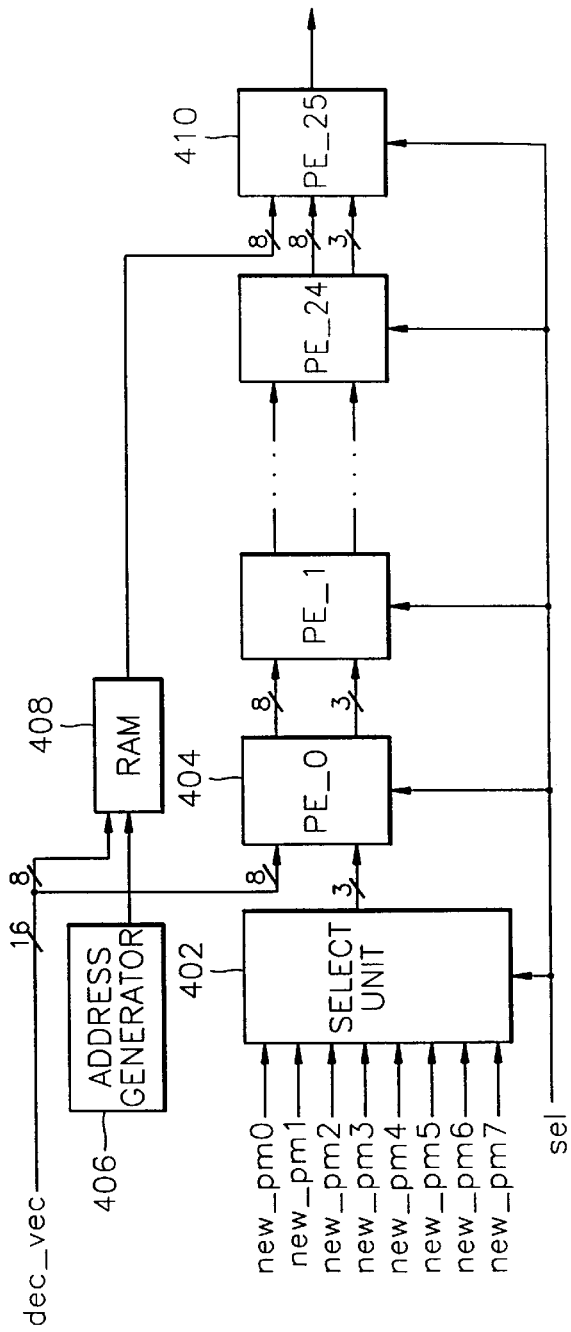
FIG. 13 is a detailed circuit diagram of a trace-back memory of FIG. 8.

Referring to FIG. 13, the TBM 400 traces-back a survival path using the path metrics of each state of an arbitrary stage output from the ACS 300 and the decision vector being previous state information, to output decoded data of 2-bits.

In FIG. 13, a select unit 402 of TBM 400 selects a state value which is the smallest one among the path metrics new_pm0 through new_pm7 of each state supplied from the ACS 300. A memory composed of a RAM 408 delays the decision vector dec_vec with respect to a parallel transition path in the decision vector dec_vec being a path select signal by a decision depth in accordance with addressing of an address generator 406.

Here, the MSB of the decision vector of 2-bit for each input state is a select signal of the parallel-transited path, and the LSB is a select signal of a state-transited path.

Each processing element (PE) (404–410) obtains the optimum state of the previous time point, i.e., a state value of the smallest path metric, using a decision vector with respect to the state-transition path in the decision vectors dec_vec supplied from the ACS 300 and the path metric selected from the select unit 402, and delays the decision vector of the state-transition path by 12-symbols. The processing elements, which are serially connected by a decision depth (here, 26 symbols), decode an original signal using the state value obtained by tracing-back by a decision depth in a final processing element 410, and a decision vector of a path with respect to the state obtained by tracing-back among the decision vectors delayed by a decision depth.

Figure 14:
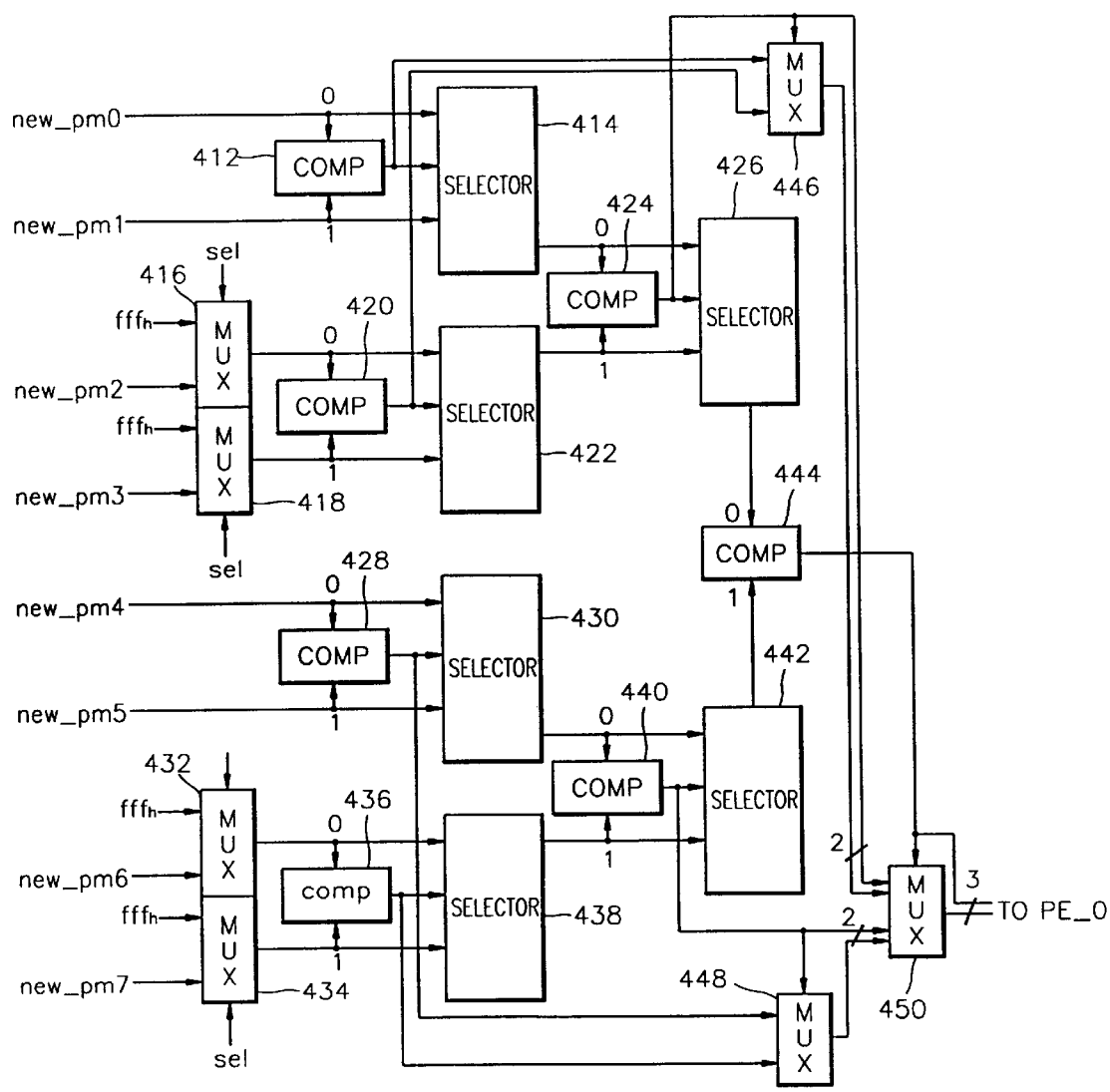
FIG. 14 is a detailed circuit diagram of a select unit of FIG. 13.

Referring to FIG. 14, the select unit 402 finds the state value having a minimum metric through three comparisons. In multiplexers 416, 418, 432 and 434 selecting path metric values new_pm2, new_pm3, new_pm6 and new_pm7, when the 4-state and 8-state select signal sel is logic low (4-state), an undefined maximum value fff$_h$ of 12-bit hexadecimal digit is selected. This is because path metric values actually used in 4-state, are only new_pm0, new_pm1, new_pm4 and new_pm5. Also, if the 4-state and 8-state select signal sel is logic high (8-state), the original path metric is selected.

That is, a selector 414 selects a smaller one of two path metrics new_pm0 and new_pm1 compared in a comparator 412. A selector 422 selects a smaller one of two path metrics new_pm2 and new_pm3 compared in a comparator 420. A selector 426 selects a smaller one of the path metrics selected by selectors 414 and 422, according to the comparison result compared in a comparator 424, and applies the selected path metric to one input terminal 0 of a comparator 444.

A multiplexer 446 selects one of outputs of comparators 412 and 420 in accordance with the comparison result of the comparator 424, and thus applies the selected signal together with the compared result to one input terminal of the multiplexer 450.

The selector 430 selects a smaller one of two path metrics new_pm4 and new_pm5 in accordance with the result obtained by comparing fifth and sixth path metrics new_pm4 and new_pm5 in a comparator 428. A selector 438 selects a smaller one of two path metrics new_pm6 and new_pm7 compared in a comparator 436. A selector 442 applies a smaller one of two path metrics selected by selectors 430 and 438, to the other input terminal of the comparator 444.

A multiplexer 448 selects an output of the comparator 428 or an output of the comparator 436 in accordance with the comparison result of a comparator 440. The output of the multiplexer 448 and the comparison result of the comparator 440 are applied to the other input terminal of the multiplexer 450. The multiplexer 450 selects the path metric of a smaller value of the outputs of the multiplexers 446 and 448 in accordance with the comparison result of the comparator 444, and adds the selected output and the output of the comparator 444 and applies a state value of a minimum metric to a first processing element 404 of FIG. 13.

Figure 15:
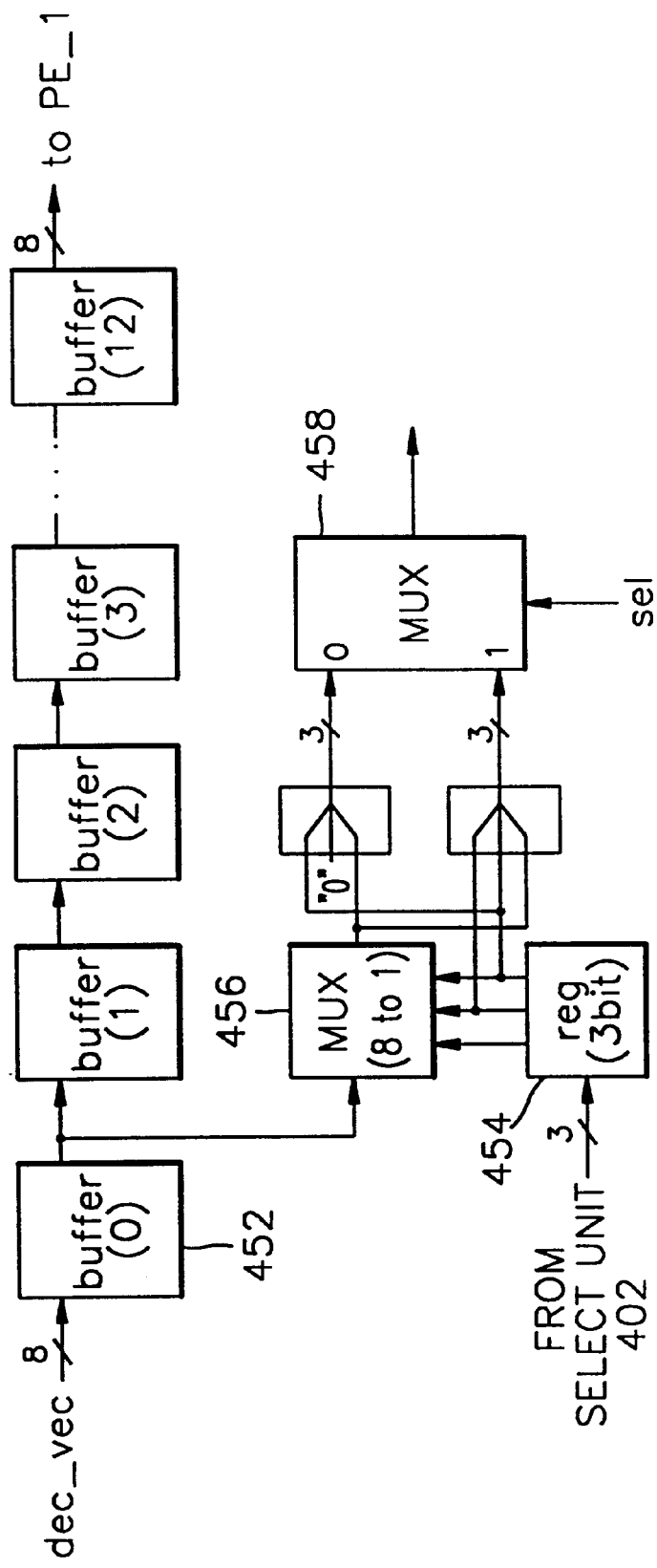
FIG. 15 shows the structure of a first processing element of FIG. 13.

FIG. 15 shows the structure of the first processing element 404 of FIG. 13. In FIG. 15, the decision vector dec_vec with respect to the state transition output from the ACS 300 is stored in a buffer 452, and the state value of a minimum metric output from the select unit 402 is applied to a 3-bit register 454.

8 bits having only the LSB corresponding to the state transition among 2-bit decision information of eight states are applied to an 8-to-1 multiplexer 456 through a buffer 452 to select 1-bit in accordance with a state value stored in a 3-bit register 454.

Thus, if the 4-state and 8-state select signal sel is logic high (8-state), the previous state value can be obtained by making the 2-bit LSB of the value stored in the register 454 the 2-bit MSB, and applying the output of a multiplexer 456 to the LSB, and the previous state value for the 8-state is applied to an input terminal 1 of a multiplexer 458. In other words, if a value of a 3-bit register 454 is $(a_2 a_1 a_0)_b$, and the output of the 8-to-1 multiplexer 456 is $(b_0)_b$, a value of the previous state becomes $(a_1 a_0 b_0)_b$.

Also, when the 4-state and 8-state select signal sel is logic low (4-state), the LSB stored in the register 454 is made the MSB, and the output of the multiplexer 456 is made to the LSB, and 0 is inserted into a second upper bit, to thereby input the values 000, 001, 100 and 101 to an input terminal 0 of the multiplexer 458 when the previous state values are 00, 01, 10 and 11, respectively.

Since the GA-VSB TCM decoder has been 12-symbol interleaved, second through twelfth buffers shown in FIG. 15 are for delaying of the 12-symbol length, so that when the interleaving depth is L, L+1 buffers are needed. Here, processing elements PE_0 through PE_24 of FIG. 13 have the same structure as that of the first processing element PE_0 of FIG. 15. Here, the input of the processing element uses the output of the previous processing element, which is only different from the function of the first processing element of FIG. 15.

Figure 16:
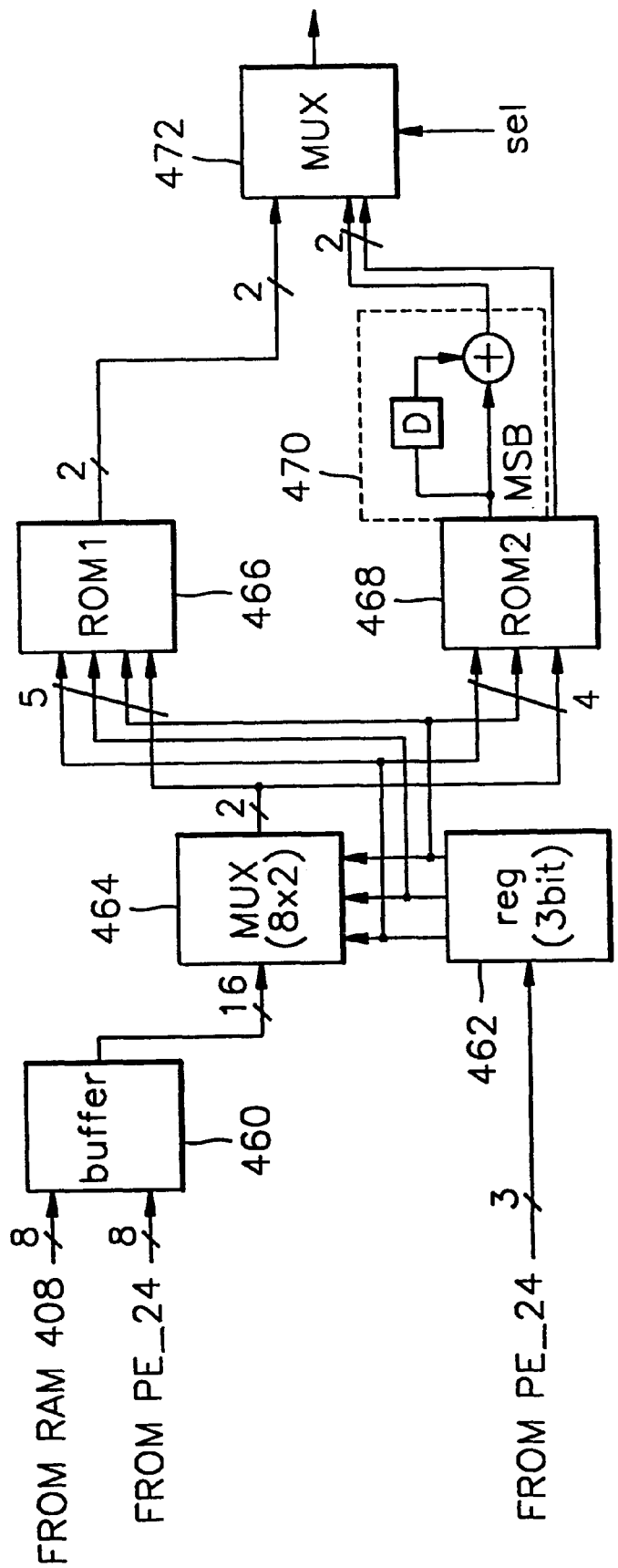
FIG. 16 shows the structure of a final processing element of FIG. 13.

Referring to FIG. 16, the final processing element 410 of FIG. 13 outputs final decoded data of the TCM decoder, so that the structure thereof is different from that of each of the processing elements PE_0 through PE_24. In FIG. 16, a buffer 460 stores a decision vector with respect to parallel-transition delayed by the RAM 408 of FIG. 13 and a decision vector with respect to the state-transition output from the previous processing element PE_24, and a current state value is stored in a 3-bit register 462.

The previous 2-bit state information with respect to eight states, is applied to a 16-to-2 multiplexer 464, to select the previous state information of 2-bits in accordance with the current state value stored in the 3-bit register 462.

In the 8-state mode, path information capable of expressing an enabling path of the 8-state trellis can be obtained from a 5-bit value consisting of the current state information of 3-bits stored in the register 462 as the MSB and a 2-bit output of the 16-to-2 multiplexer 464 as the LSB.

In the 4-state mode, path information of 4-bits can be obtained by adding the MSB and LSB of 2-bit only selected from the current state information of 3-bits stored in the register 462 to a 2-bit output selected from the 16-to-2 multiplexer 464.

Thus, when a first ROM 466 for the 8-state mode and a second ROM 468 for the 4-state mode are driven by using the path information as an address value, final decoded data of 2-bit can be obtained. Finally, a selector 472 selects one of the outputs of the first and second ROMs 466 and 468 in accordance with a 4-state and 8-state select signal sel, to output decoded data.

Here, a ROM table with respect to the first and the second ROMs 466 and 468 are shown in FIG. 17. For example, in the 8-state mode, when a current state value stored in the register 462 is 101, and the previous state information selected from the multiplexer 464 is 10, the input of the first ROM 466 is 10110(=$16_{HEX}$), and the decoded 2-bit data 10 is output from the first ROM 466.

Figures 1A, 1B:
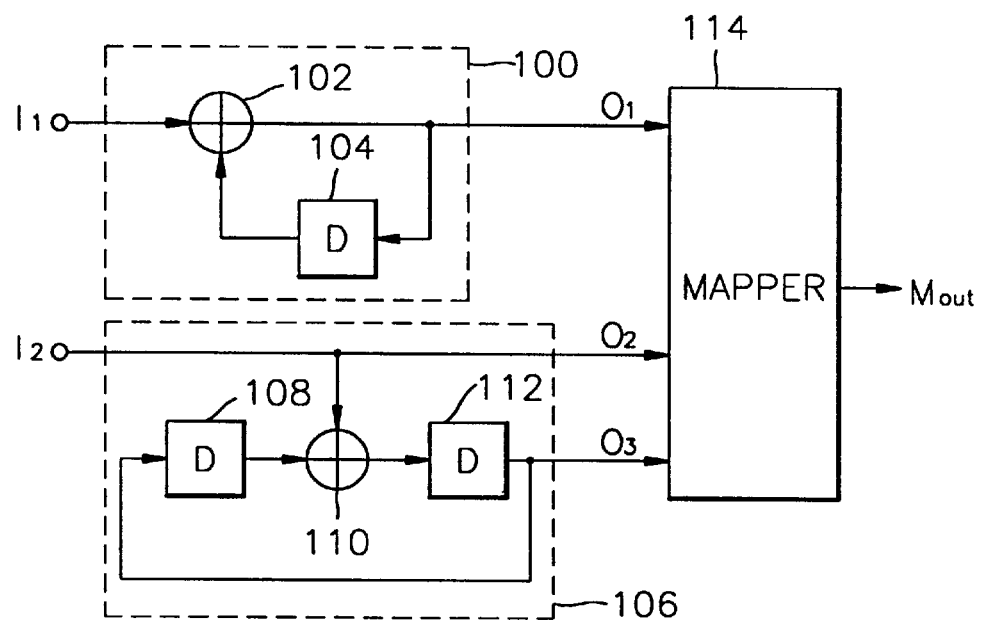
FIG. 1A is a diagram showing the structure of a TCM coder of a GA-VSB system.
FIG. 1B is a table showing the input and output of a mapper of FIG. 1A.

Meanwhile, as shown in the TCM encoder of FIG. 1A, the 1-bit MSB of the received 2-bits is differential-encoded. Thus, in the 4-state mode, the MSB of the output of the second ROM 468 must pass through a differential decoder 470, and in the 8-state mode, no additional differential decoder is required as shown in the TCM encoder of FIG. 4A.

Thus, the selector 472 selects the output of the first ROM 466 which is not differential-decoded, in the 8-state mode in accordance with the 4-state and 8-state select signal sel, and selects the differential-decoded MSB from the differential decoder 470 and the LSB of the output of the second ROM 468 in the 4-state, to output finally decoded data.

In a TCM method of the SA structure according to the present invention, decoding is performed in a feed-forward direction, so that the structure is simple, and when the number of states is less and the decoding depth is short, it is more useful.

According to the present invention, the TCM decoder using a single decoder can correspond to 12-symbol interleaving, and can concurrently decode in an 8-state mode, even when a comb filter is used to remove the effect of the NTSC signal, and in a 4-state mode, so that a decoder can be simply realized.

What is claimed is:

1. A trellis coded modulation (TCM) decoder in a digital television receiver using a comb filter for removing the effect of an NTSC signal, comprising:

a branch metric generator calculating a Euclidian distance between a received input data and a reference signal, corresponding to the case of 8-state passing through the comb filter and the case of 4-state not passing through the comb filter, and generating a branch metric value of a path having the smallest value from parallel-transited paths, according to each state and a parallel-transition path select signal wherein said each state is based on a trellis state diagram having transition to share 4-state and 8-state;

an addition-comparison selector adding a branch metric value with respect to the parallel-transited path obtained by the branch metric generator to a previous accumulated path metric value, and comparing the added results according to each state to generate the smallest path metric value and a corresponding path select signal; and a trace-back memory tracing-back the trellis using the path select signal and the path metric values of each state, corresponding to both the 4-state and the 8-state, to thereby decode an original signal, in units of a predetermined number of symbols corresponding to interleaving in units of the predetermined number of symbols.

2. The TCM decoder of claim 1, wherein the branch metric generator comprises:

a subtracter subtracting 1 from the received input data;

a first selector selecting, in accordance with a 4-state/8-state select signal, an output of the subtracter in the case of 4-state, and the received input data in the case of 8-state; and a plurality of subunits obtaining each branch metric of the smallest value of the parallel-transited paths according to each state, with respect to a value selected by the first selector.

3. The TCM decoder of claim 2, wherein said each subunit comprises:

a subtracter obtaining a difference between a reference level value using one of parallel-transited values as a reference level and the received input data and outputting a sign signal of the difference and a difference value of the difference;

a second selector selecting one of a value obtained by adding a first value to the difference value and a value obtained by adding a negative value of the first value to the difference value, using the sign signal;

a first generator comparing an absolute value of the difference value with an absolute value of an output of the second selector and selecting a path having a smaller value, to thereby generate a parallel-transition path select signal; and a second generator selecting one of an absolute value of the difference value and an absolute value of an output of the second selector in accordance with the parallel-transition path select signal, to thereby generate a branch metric value corresponding to the square of the selected value.

4. The TCM decoder of claim 1, wherein said addition-comparison selector comprises:

a plurality of survival path determiners adding the branch metric value of the smallest value of the parallel-transited path obtained from the branch metric generator to the previous path metric values in accordance with each of the states, to thereby generate a new path metric value and a decision vector with respect to each of the states;

a normalizer normalizing the new path metric values output from the plurality of survival path determiners; and a delay delaying an output of the normalizer by an interval of the predetermined number of symbols to output the previous path metric values in accordance with each of the states.

5. The TCM decoder of claim 1, wherein said trace-back memory comprises:

a select unit for selecting a state value of the smallest one from path metric values for each of the states supplied from the addition-comparison selector; and a plurality of processing elements corresponding to the decision depth obtaining a state value having the minimum path metric value at a previous time, using a decision vector indicating the state transition path from the decision vector being the path select signal and the state value of the smallest path metric value.

6. The TCM decoder of claim 5, wherein said trace-back memory further comprises a memory delaying a decision vector indicating a parallel-transition path in the decision vector being the path select signal by the decision depth.

7. The TCM decoder of claim 6, wherein said first processing element of the plurality of processing elements comprises:

a detector detecting previous state values of the 4-state and the 8-state, using an optimum state value at a current time output from the select unit and the state transition decision vector; and a delay unit delaying the state transition decision vector by the interval of the predetermined number of symbols, each of the second through next-to-last processing elements comprises:

a detector detecting previous state values of the 4-state and the 8-state, using an optimum state value of a previous time point output from the immediately previous processing element and a delayed state transition decision vector; and a delay unit delaying the delayed state transition decision vector by the interval of the predetermined number of symbols, and the last processing element comprises:

a third selector selecting one from the previous path information consisting of the parallel path decision vector supplied from the memory and the delayed state transition decision vector, according to the optimum state value of the previous time, output from the immediately previous processing element;

a first ROM reading out decoded data for the 8-state in accordance with the path information for the 8-state obtained by combining the selected previous path information and the optimum state value of the previous time point;

a second ROM reading decoded data for the 4-state in accordance with the path information for the 4-state obtained by combining the selected previous path information and the optimum state value of the previous time point;

a differential decoder differential-decoding the MSB of the decoded data for the 4-state; and a fourth selector selecting decoded data stored in the first ROM in the 8-state, and data obtained by adding a differential-decoded data to the LSB of the decoded data stored in the second ROM in the 4-state, in accordance with a 4-state and 8-state select signal.

8. A TCM decoding method decoding signals to 4-state or 8-state in accordance with whether a comb filter is used for removing effects of an NTSC signal, comprising the steps of:

(a) calculating a Euclidian distance between received input data corresponding to the case of 8-state passing through the comb filter and the case of 4-state not passing through the comb filter and a reference signal, and generating a branch metric value of a path having the smallest value from the parallel-transited paths according to each state and a parallel-transition path select signal, wherein said each state is based on a trellis state diagram having transition to share the 4-state and the 8-state;

(b) adding a branch metric value with respect to a generated parallel-transited path to a previous accumulated path metric value, comparing the added result in accordance with each of the states to accordingly generate a path metric value of the smallest state value and a corresponding path select signal; and (c) tracing-back the trellis using the path select signal and the path metric value of each state, corresponding to both the 4-state and the 8-state, to thereby decode an original signal in units of a predetermined number of symbols corresponding to interleave in units of the predetermined number of symbols.

9. The method of claim 8, wherein step (a) comprises the substeps of:

(a1) subtracting 1 from received input data corresponding to the case of the 4-state to obtain a subtraction result;

(a2) selecting, in accordance with a 4-state and 8-state select signal, the subtraction result in the 4-state and the received input data in the 8-state;

(a3) obtaining a difference between a reference level value using one of parallel-transited values as a reference level and the received input data and outputting a sign signal of the difference and a difference value indicating the difference;

(a4) selecting one of a value obtained by adding a first value to the difference value and a value obtained by adding a negative value of the first value to the difference value, using the sign signal, to thereby output a first signal;

(a5) comparing an absolute value of the difference value with an absolute value of the first signal to generate a parallel transition path select signal selecting a path of a smaller value; and (a6) selecting one of the absolute values of the difference value and the first signal in accordance with the parallel transition path select signal to generate a branch metric value corresponding to a squared selected value.

10. The method of claim 8, wherein step (b) comprises the substeps of:

(b1) adding a branch metric value having the smallest one selected from paths parallel-transited according to each of the states to a previous path metric value to generate a new path metric value and a decision vector with respect to each of the states;

(b2) normalizing a new path metric value with respect to each of the states; and (b3) delaying the normalized path metric value by an interval of the predetermined number of symbols to output the delayed value as the previous path metric value.

11. The method of claim 8, wherein step (c) comprises:

(c1) selecting a state value having the smallest one from the path metric values with respect to each of the states;

(c2) obtaining an optimum state value at a previous time, using the decision vector being a path select signal and a state value of the smallest path metric value with respect to each state; and (c3) decoding an original signal using a state value obtained by tracing-back the optimum state value by the decision depth in the previous time and a path select signal with respect to the obtained state.

12. The method of claim 11, further comprising the step of delaying a decision vector indicating the parallel transition path from the decision vector being the pass select signal by the decision depth.

* * * * *